US011668737B2

(12) United States Patent
Lash

(10) Patent No.: US 11,668,737 B2
(45) Date of Patent: Jun. 6, 2023

(54) SELF-CALIBRATING TRANSMISSION LINE RESONATOR OSCILLATING DRIVER APPARATUS

(71) Applicant: Dell Products L.P., Round Rock, TX (US)

(72) Inventor: Steven Jay Lash, Leander, TX (US)

(73) Assignee: Dell Products L.P., Round Rock, TX (US)

( * ) Notice: Subject to any disclaimer, the term of this patent is extended or adjusted under 35 U.S.C. 154(b) by 309 days.

(21) Appl. No.: 17/197,457

(22) Filed: Mar. 10, 2021

(65) Prior Publication Data

US 2022/0291265 A1    Sep. 15, 2022

(51) Int. Cl.
| | |
|---|---|
| *H04B 17/11* | (2015.01) |
| *G01R 27/06* | (2006.01) |
| *G01R 27/32* | (2006.01) |
| *G01R 27/26* | (2006.01) |
| *H04B 17/10* | (2015.01) |
| *H04B 17/14* | (2015.01) |

(52) U.S. Cl.
CPC ......... *G01R 27/06* (2013.01); *G01R 27/2664* (2013.01); *G01R 27/32* (2013.01); *H04B 17/103* (2015.01); *H04B 17/11* (2015.01); *H04B 17/14* (2015.01)

(58) Field of Classification Search
CPC ...... H04B 17/14; H04B 17/11; H04B 17/103; G01R 27/32; G01R 27/2664; G01R 27/06
See application file for complete search history.

(56) References Cited

U.S. PATENT DOCUMENTS

| | | | |
|---|---|---|---|
| 6,992,501 B2 | 1/2006 | Rapport | |
| 7,068,049 B2 * | 6/2006 | Adamian | G01R 27/28 324/638 |
| 10,942,210 B2 * | 3/2021 | Sohn | G01R 23/165 |

(Continued)

OTHER PUBLICATIONS

Sanada, Atsushi, Christophe Caloz, and Tatsuo Itoh. "Novel zeroth-order resonance in composite right/left-handed transmission line resonators." *Proc. Asia-Pacific Microwave Corf.* vol. 3. 2003.

(Continued)

*Primary Examiner* — Jeff W Natalini
(74) *Attorney, Agent, or Firm* — McDermott Will & Emery LLP

(57) ABSTRACT

A self-calibrating transmission line resonator oscillating driver apparatus, including: a first output driver module configured to transmit a first forward signal along a transmission line; a second output driver module configured to transmit a second forward signal along the transmission line; a first reflection detection module configured to detect a first return signal of the first forward signal reflected along the transmission line; and a second reflection detection module configured to detect a second return signal of the second forward signal reflected along the transmission line; wherein, when the first reflection detection module detects the first return signal of the first forward signal reflected along the second direction of the transmission line, providing a signal to i) change a power state of the first output driver module to an off-power state and to ii) change a power state of the second output driver module to an on-power state.

20 Claims, 5 Drawing Sheets

(56) References Cited

U.S. PATENT DOCUMENTS

| | | | | |
|---|---|---|---|---|
| 2006/0002239 | A1* | 1/2006 | Gage | G01R 31/3191 368/118 |
| 2009/0310388 | A1* | 12/2009 | Yang | G01R 19/0092 363/21.13 |
| 2016/0211928 | A1* | 7/2016 | Brewer | H04B 17/103 |
| 2020/0309864 | A1* | 10/2020 | Chen | G01R 31/71 |

OTHER PUBLICATIONS

Russell, Daniel A. "Acoustics and vibration animations: Reflection of Waves from Boundaries." *Graduate Program in Acoustics, The Pennsylvania State University* (2014).

"Half & Quarter Wave Length Transmission Lines." https://www.daenotes.com/electronics/communication-system/half-quarter-wave-length-transmission-lines, Retrieved Nov. 17, 2021.

"14.4 Transients on Bounded Transmission Lines," web.mit.edu/6.013_book/www/chapter14/14.4.html, Retrieved Nov. 17, 2021.

Open Circuit Transmission Line, Electromagnetics 3025, Georgia Tech, http://propagation.ece.gatech.edu/ECE3025/tutorials/SmusoidalTlines/OpenCircuit.htm, Retrieved Nov. 17, 2021.

Semiconductor, Fairchild. "Transmission-Line Effects Influence High-Speed CMOS." *Semiconductor Components Industries*, Aurora, Colorado 80011.

Hashemi, Kevan, "Transmission Line Analysis—Reflection coefficient", http://www.bndhep.net/Lab/XLine/XLine.html#Reflection®20Coefficient, Retrieved Nov. 17, 2021.

Becker, Matthew Erin. *Resonant transmission line drivers*. Diss. Massachusetts Institute of Technology, 2000.

Q Factor, https://en.wikipedia.org/wiki/Q_factor, Retrieved Nov. 17, 2021.

Resonance, https://en.wikipedia.org/wiki/Resonance, Retrieved Nov. 17, 2021.

Antenna (Efficiency), https://en.wikipedia.org/wiki/Antenna_(radio)#Efficiency, Retrieved Nov. 17, 2021.

Electrical Resonance, https://en.wikipedia.org/wiki/Electrical_resonance, Retrieved Nov. 17, 2021.

Resonator, https://en.wikipedia.org/wiki/Resonator#Transmission-line_resonators, Retrieved Nov. 17, 2021.

Crystal Oscillator, https://en.wikipedia.org/wiki/Crystal_oscillator, Retrieved Nov. 17, 2021.

Reflection Phase Change. https://en.wikipedia.org/wiki/Reflection_phase_change, Retrieved Nov. 17, 2021.

* cited by examiner

SELF-CALIBRATING TRANSMISSION LINE RESONATOR OSCILLATING DRIVER APPARATUS

BACKGROUND

Field of the Disclosure

The disclosure relates generally to an information handling system, and in particular, self-calibrating transmission line resonator oscillating driver apparatus.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Off-resonant variations in a frequency driven into a transmission line can cause reduced broadcast efficiency. Dynamic real-time electrical characteristic variations of the transmission line (and transmission line resonator elements) make it difficult to precisely match in real-time the frequency driven into the transmission line at the drifting frequency of the transmission line. Typically, the frequency that is driven down a transmission line is pre-selected for various purposes without regard to the resonant frequency of the transmission line delivering the signal; or the transmission line length is pre-selected to approximate the wavelength of the frequency driven down the transmission line. However, neither of these approaches maintain optimal resonation with the transmission line, and are susceptible to real-time changes and variations in the transmission line electrical characteristics that can lead to a sub-optimal resonant frequency.

SUMMARY

Innovative aspects of the subject matter described in this specification may be embodied in an apparatus including a self-calibrating transmission line resonator oscillating driver apparatus, including a first output driver module configured to transmit a first forward signal of a first magnitude along a first direction of a transmission line; a second output driver module configured to transmit a second forward signal of a second magnitude along the first direction of the transmission line; a first reflection detection module configured to detect a first return signal of the first forward signal reflected along a second direction of the transmission line; and a second reflection detection module configured to detect a second return signal of the second forward signal reflected along the second direction of the transmission line; wherein, when the first reflection detection module detects the first return signal of the first forward signal reflected along the second direction of the transmission line, providing a signal to i) change a power state of the first output driver module to an off-power state and to ii) change a power state of the second output driver module to an on-power state, wherein, when the second reflection detection module detects the second return signal of the second forward signal reflected along the second direction of the transmission line, providing a signal to i) change the power state of the first output driver module to an on-power state and to ii) change the power state of the second output driver module to an off-power state.

Other embodiments of these aspects include corresponding systems and methods.

These and other embodiments may each optionally include one or more of the following features. For instance, an amplitude of the second forward signal is twice an amplitude of the first forward signal. The amplitude of the first forward signal is one-third of a supply voltage to the transmission line, and the amplitude of the second forward signal is two-thirds of the supply voltage to the transmission line. The second forward signal is 180 degrees out of phase with the first forward signal. The first forward signal and the first return signal are in-phase. An amplitude of the first return signal is twice an amplitude of the first forward signal. The transmission line is an unterminated transmission line having infinite impedance at the end of the line. Only one of the first output driver module and the second output driver module are in a powered-on state at a time. Only one of the first output driver module and the second output driver module are transmitting the first forward signal and the second forward signal, respectively, at a time.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

This disclosure discusses methods and systems for matching a resonant frequency of a transmission line. In short, an oscillating driver module can generate/drive a resonant frequency along a transmission line while optimizing broadcast power output and efficiency. The oscillating driver module can self-calibrate its output frequency to the resonant frequency of the transmission line. As a result, the variable factors for propagation velocity and delay due to variations in impedance are accounted for. Further, as the environment changes, the frequency driven by the oscillating driver module can change accordingly. Thus, the frequency that is driven by the oscillating driver module can match an optimal resonant frequency of the transmission line 106.

Specifically, this disclosure a self-calibrating transmission line resonator oscillating driver apparatus, including: a first output driver module configured to transmit a first forward signal of a first magnitude along a first direction of a transmission line; a second output driver module configured to transmit a second forward signal of a second magnitude along the first direction of the transmission line; a first reflection detection module configured to detect a first return signal of the first forward signal reflected along a second direction of the transmission line; and a second reflection detection module configured to detect a second return signal of the second forward signal reflected along the second direction of the transmission line; wherein, when the first reflection detection module detects the first return signal of the first forward signal reflected along the second direction of the transmission line, providing a signal to i) change a power state of the first output driver module to an off-power state and to ii) change a power state of the second output driver module to an on-power state, wherein, when the second reflection detection module detects the second return signal of the second forward signal reflected along the second on the transmission line, providing a signal to i) change the power state of the first output driver module to an on-power state and to ii) change the power state of the second output driver module to an off-power state.

In the following description, details are set forth by way of example to facilitate discussion of the disclosed subject matter. It should be apparent to a person of ordinary skill in the field, however, that the disclosed embodiments are exemplary and not exhaustive of all possible embodiments.

Particular embodiments are best understood by reference to FIGS. 1-5 wherein like numbers are used to indicate like and corresponding parts.

Figure 1:
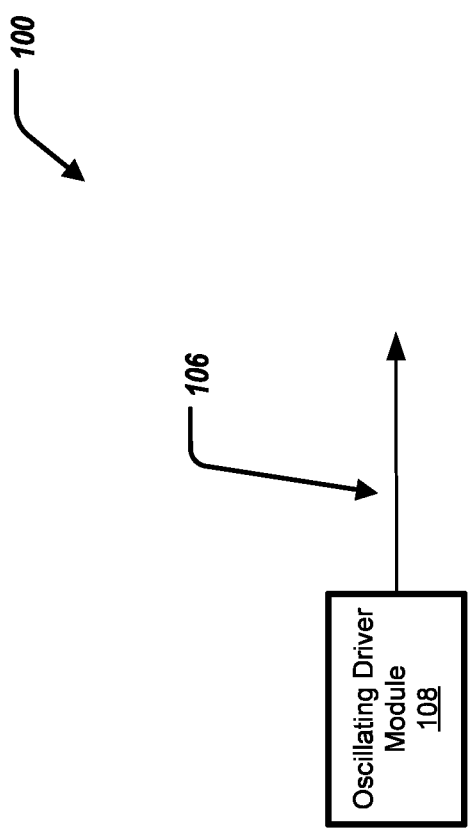
FIG. 1 is a block diagram of selected elements of an embodiment of a computing environment.

Turning now to the drawings, FIG. 1 illustrates a block diagram depicting selected elements of a computing environment 100 including a transmission line 106 and an oscillating driver module 108 (or a self-calibrating transmission line resonator oscillating driver 108). The oscillating driver module 108 can dynamically adapt in real time to electrical characteristics variations of the transmission line 106 to match a resonant frequency of the transmission line 106, described further herein. In some examples, the transmission line 106 can be connected between two transceivers transmitting a signal along the transmission line 106. For example, the oscillating driver module 108 can be implemented with radio antennas, microwave transmission line elements, and computer baseboards (coplanar, stripline, and microstrip). The oscillating driver module 108 is positioned at the end point along the transmission line 106 to facilitate matching of the resonant frequency of the transmission line 106. In this example, the oscillating driver module 108 is positioned at one end of the transmission line 106. In some examples, the environment 100 can be applicable to radio broadcasts, as well as clock signals being driven down a conductor on a printed circuit board (PCB). In some examples, the environment 100 can be applicable to cryogenic solid-state devices, superconducting transmission-line resonators, solid-state spectroscopy, and quantum information science.

In short, the oscillating driver module 108 can generate/drive a resonant frequency along the transmission line 106 while optimizing broadcast power output and efficiency. The oscillating driver module 108 can self-calibrate its output frequency to the resonant frequency of the transmission line 106. As a result, the variable factors for propagation velocity and delay due to variations in impedance are accounted for. Further, as the environment changes (e.g., the environment 100 or properties of the transmission line 106), the frequency driven by the oscillating driver module 108 can change accordingly. Thus, the frequency that is driven by the oscillating driver module 108 can match an optimal resonant frequency of the transmission line 106.

Figure 2:
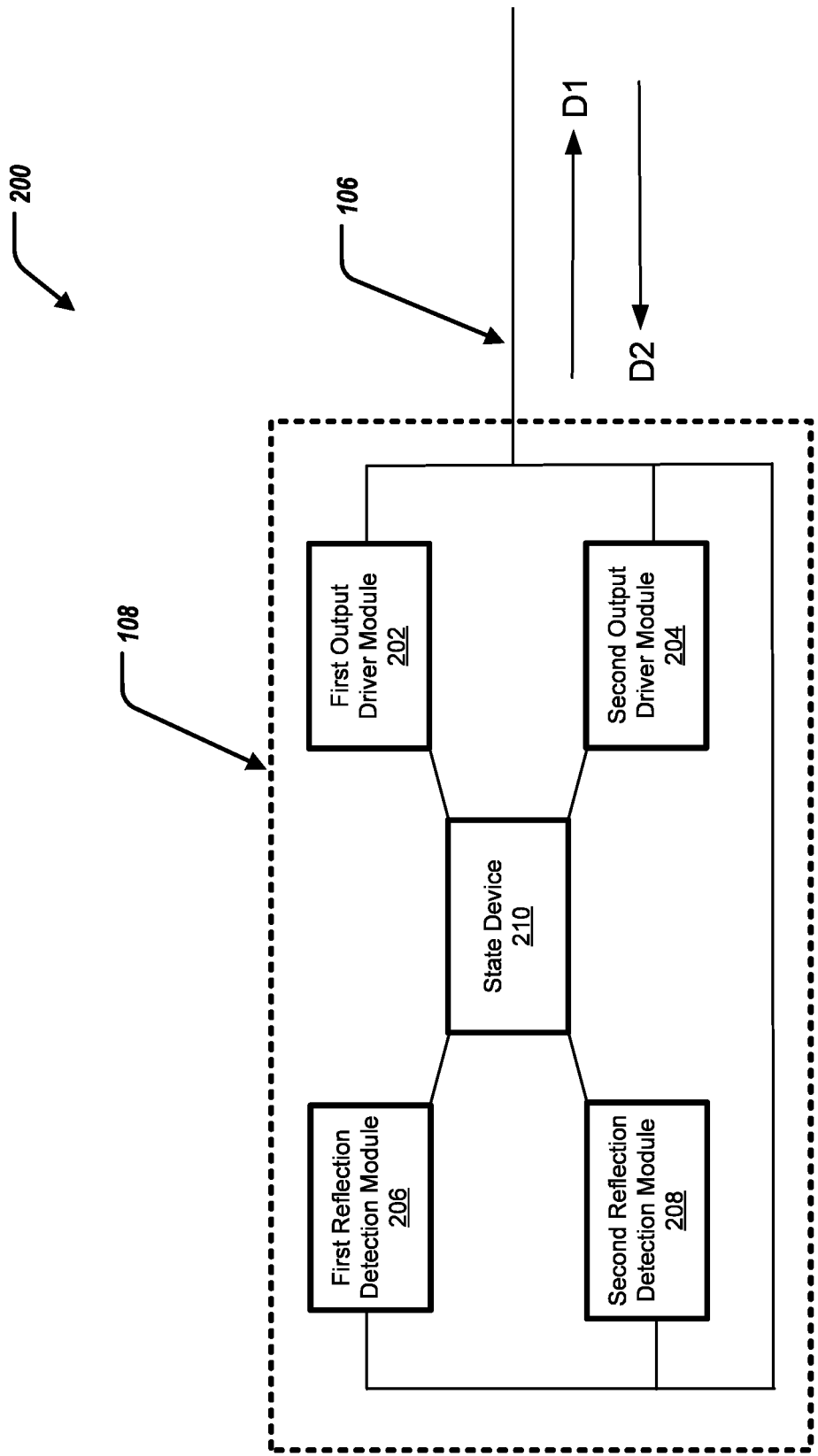
FIG. 2 illustrates a block diagram of the environment including an oscillating driver module and an transmission line.

Turning to FIG. 2, FIG. 2 illustrates an environment 200 including the oscillating driver module 108 and the transmission line 106. The oscillating driver module 108 can include a first output driver module 202, a second output driver module 204, a first reflection detection module 206, a second reflection detection module 208, and a state device 210. The state device 210 can be in communication (or connected) with the first output driver module 202, the second output driver module 204, the first reflection detection module 206, and the second reflection detection module 208. In short, the oscillating driver module 108 can generate a signal (or signals) to resonate at one-half the resonant frequency of the transmission line 106.

In some examples, the transmission line 106 is an unterminated transmission line. That is, the far end or distal end of the transmission line 106 can be associated with an infinite impedance.

In some examples, the state device 210 can include a flip-flop circuit (latch circuit).

The first output driver module 202 is configured to transmit a first forward signal of a first magnitude along a first direction (e.g., direction D1) of the transmission line 106. That is, the first output driver module 202 can generate/produce the first forward signal with a high slew rate equal to one-third of the amplitude of a supply voltage to the oscillating driver module 108. In some examples, the amplitude of the first forward signal is one-third of the supply voltage to the transmission line 106. Other amplitudes of the first forward signal are possible depending on the application desired.

The first reflection detection module 206 is configured to detect a first return signal of the first forward signal reflected along a second direction (e.g., direction D2) of the transmission line 106. Specifically, as the transmission line 106 is an unterminated (not terminated) transmission line, there is an abrupt change in impedance at an end point of the transmission line 106, thus causing a reflection of the first forward signal as the first return signal. The first forward signal and the first return signal are in-phase. An amplitude of the first return signal is twice (or approximately twice) that of an amplitude of the first forward signal.

The second output driver module 204 is configured to transmit a second forward signal of a second magnitude along the first direction (e.g., direction D1) of the transmission line 106. That is, the second output driver module 204 can generate/produce the second forward signal with a high slew rate equal to one-third of the amplitude of a supply voltage to the oscillating driver module 108. The second forward signal is 180 degrees out of phase with the first forward signal. In some examples, the amplitude of the second forward signal can be twice an amplitude of the first forward signal. In some examples, the amplitude of the second forward signal is two-third of the supply voltage to the transmission line 106. Other amplitudes of the second forward signal are possible depending on the application desired.

The second reflection detection module 208 is configured to detect a second return signal of the second forward signal reflected along the second direction (e.g., direction D2) of the transmission line 106. Specifically, as the transmission line 106 is an unterminated (not terminated) transmission line, there is an abrupt change in impedance at an end point of the transmission line 106, thus causing a reflection of the second forward signal as the second return signal. The second forward signal and the second return signal are in-phase. An amplitude of the second return signal is twice (or approximately twice) that of an amplitude of the second forward signal. The second forward signal is in-phase with the second return signal.

To that end, when the first reflection detection module 206 detects the first return signal of the first forward signal reflected along the second direction of the transmission line 106, the first reflection detection module 206 can provide a signal to the state device 210. In response to the signal, the state device 210 can change states and provide signals to the first output driver module 202 and the second output driver module 204 to i) change a power state of the first output driver module 202 to an off-power state and ii) change a power state of the second output driver module 204 to an on-power state. As a result, when the first reflection detection module 206 detects the first return signal of the first forward signal reflected along the second direction of the transmission line 106, the second output driver module 204 transmits the second forward signal of the second magnitude along the first direction of the transmission line 106. Furthermore, when the first reflection detection module 206 detects the first return signal of the first forward signal reflected along the second direction of the transmission line 106, the first output driver module 202 ceases to transmit the first forward signal of the first magnitude along the first direction of the transmission line 106.

Furthermore, when the second reflection detection module 208 detects the second return signal of the second forward signal reflected along the second direction of the transmission line 106, the second reflection detection module 208 can provide a signal to the state device 210. In response to the signal, the state device 210 can change states and provide signals to the first output driver module 202 and the second output driver module 204 to i) change the power state of the first output driver module 202 to an on-power state and ii) change the power state of the second output driver module 204 to an off-power state. As a result, when the second reflection detection module 208 detects the second return signal of the second forward signal reflected along the second direction of the transmission line 106, the first output driver module 202 transmits the first forward signal of the first magnitude along the first direction of the transmission line 106. Furthermore, when the second reflection detection module 208 detects the second return signal of the second forward signal reflected along the second direction of the transmission line 106, the second output driver module 204 ceases to transmit the second forward signal of the second magnitude along the first direction of the transmission line 106.

In other words, only one of the first output driver module 202 and the second output driver module 204 are in a powered-on state at a time. Specifically, only one of the first output driver module 202 and the second output driver module 204 are transmitting the first forward signal and the second forward signal, respectively, at a time.

Figure 3:
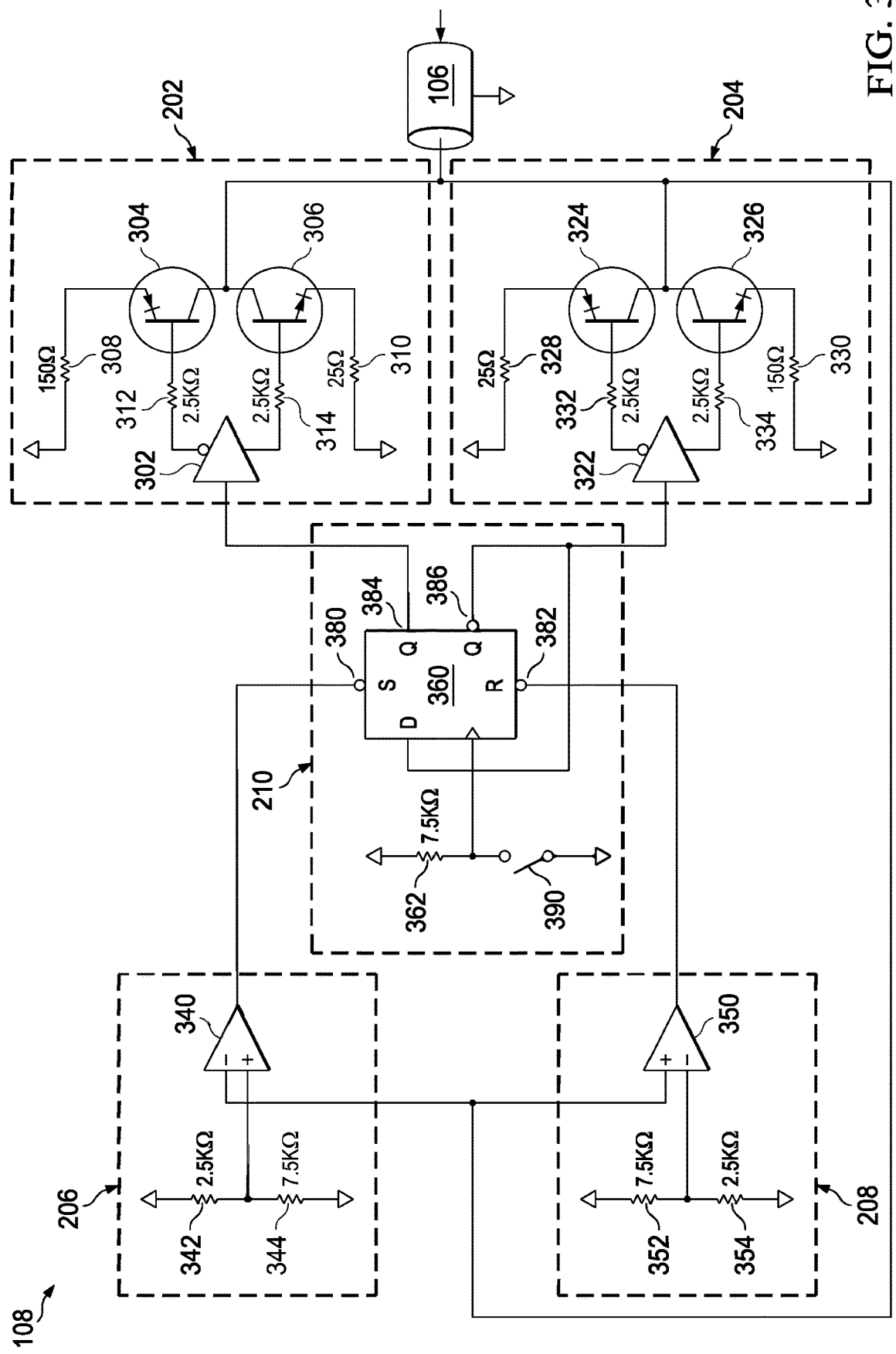
FIG. 3 illustrates a circuit diagram of the oscillating driver module.

FIG. 3 illustrates a circuit diagram 300 of the oscillating driver module 108. The first output driver module 202 includes an op-amp 302; transistors 304, 306; and resistors 308, 310, 312, 314. The second output driver module 204 includes an op-amp 322; transistors 324, 326; and resistors 328, 330, 332, 334. The first reflection detection module 206 includes an op-amp 340; and resistors 342, 344. The second reflection detection module 208 includes an op-amp 350; and resistors 352, 354. The state device 210 includes a flip-flop circuit 360 and a resistor 362. The transistors 304, 306, 324, 326 can include bi-polar junction transistors (BJT) and/or field effect transistors (FET) depending on the application.

The flip-flop circuit 360 (or driver output selection circuit 360) can be a D-type flip flop (or D flip flop). The flip-flop circuit 360 can include a set input 380, a reset input 382, a Q output 384, and a QNOT output 386. The set input 380 is activated by the first reflection detection module 206, and the reset input 382 is activated by the second reflection detection module 208. The Q output 384 activates the first output driver module 202, and the QNOT output 386 activates the second output driver module 204.

When the oscillating driver module 108 is initially powered up (powered-on state), the state of the flip-flop circuit 360 will be in an undetermined state. Independent of the state of the flip-flop circuit 360, one of the first output driver module 202 and the second output driver module 204 will be enabled and generating a respective first forward signal or second forward signal. When a switch 390 is open, the flip-flop circuit 360 changes state of the Q output 384, QNOT output 386 from previous states to opposite states. This will result in a switch between the output driver modules 202, 204 such that the output driver modules 202, 204 that was previously generating the respective forward signal will be placed in an off-state, and the output driver module 202, 204 that was not previously generating the respective forward signal will be placed in an on-state. The switching between the output driver modules 202, 204 will drive a transition equal to one-third a supply voltage on the transmission line 106.

The forward signal will propagate to an end point of the transmission line 106, and as the transmission line 106 is not terminated (infinite impedance), a return signal (minus any parasitic loss) is reflected back in-phase at the same amplitude (one-third) of the forward signal plus additional amplitude (one-third) of an existing DC offset present on the transmission line 106 from the respective output driver module 202, 204. This causes a doubling in voltage to two-thirds amplitude of the return signal.

Figure 4:
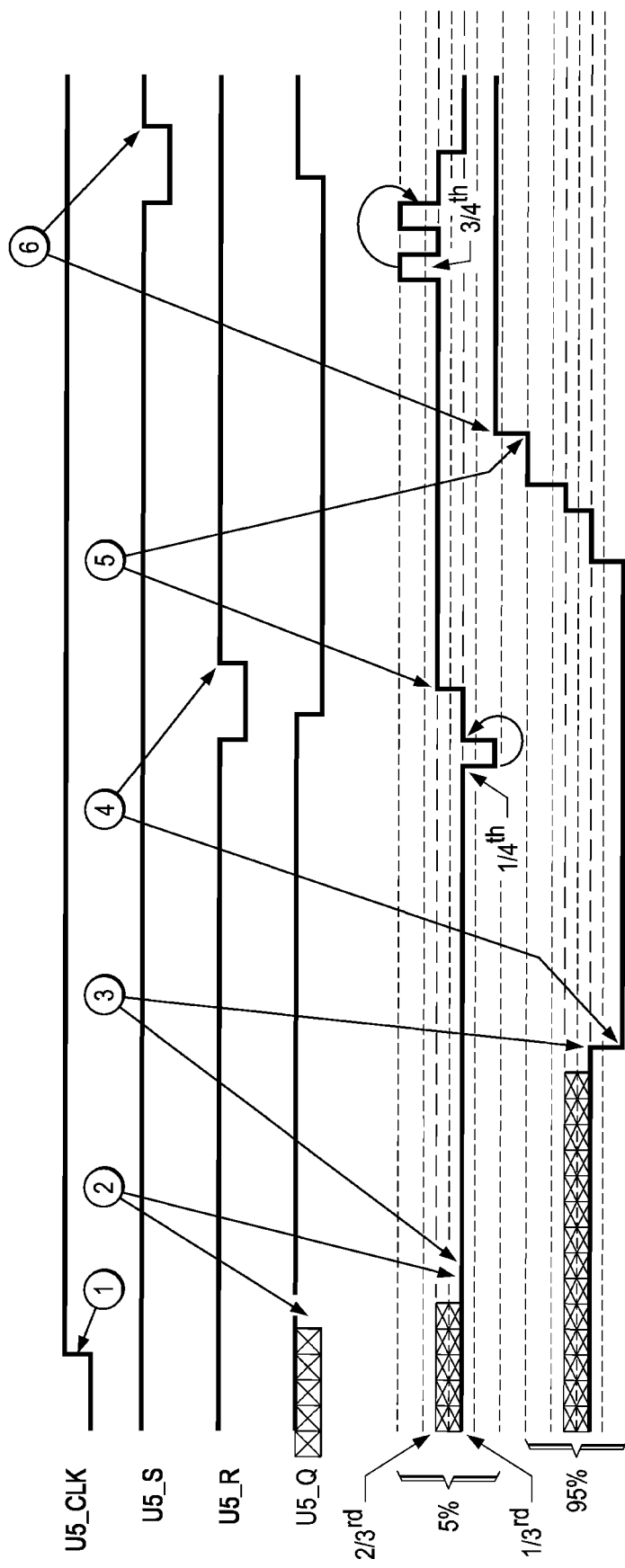
FIG. 4 illustrates a timing diagram of the oscillating driver module.

FIG. 4 illustrates a timing diagram of the oscillating driver module 108. At point 1, a rising edge of a clock of the flip-flop circuit 360 forces the Q output 384 to change states. As illustrated, the Q output 384 was previously low. If the Q output 384 was previously high, then the voltages at 5% and 95% transmission line 106 distance monitor points would be inverted from the illustration. As the Q output 384 was previously low, the op-amp 322 would turn on the transistors 324, 326 to active the voltage divider formed by the resistors 328, 330 driving the transmission line to two-thirds amplitude.

At points 2, when the Q output 384 is high, op-amp 302 turns on the transistors 304, 306 activating the voltage divider formed by the resistors 308, 310. The transmission line 106 will be driven from two-thirds amplitude to one-third amplitude driving a signal (wave) down the transmission line 106 toward the end of the line point.

At points 3, the first forward signal traveling down the transmission line 106 is shown at 5% distance points from the first output driver module 202. At the 95% distance point from the first driver module 202, the diagram 400 shows the first forward signal prior to the signal reaching the end of line point and after the first forward signal reflects from the end of the line point. When the first forward signal hits the end of line point, the first forward signal doubles in amplitude from one-third amplitude to near zero amplitude (assuming some return loss parasitic).

At points 4, the first return signal (return wave) propagates back towards the first output driver module 202. When the first return signal reaches the first output driver module 202 (as shown at the 5% distance point), the voltage level of the first return signal passes below the one-fourth amplitude level (which is detected by the second reflection detection module 208) (however, other amplitude levels are possible). When the voltage level of the first return signal passes below the one-third amplitude level, the first output driver module 202 absorbs any energy contained in the first return signal that drives the voltage below the one-third amplitude level. The second reflection detection module 208 is activated and drives a low voltage to the reset input 382 of the flip-flop circuit 360. The flip-flop circuit 360 will in turn drive the QNOT output 386 high and the Q output 384 low. When the QNOT output 386 is driven high, the op-amp 322 will turn on transistors 324, 326 thereby activating the voltage divider made by the resistors 328, 330. When Q output 384 is low, the flip-flop circuit 360 turn off transistors 304, 306 thereby deactivating the voltage divider made by the resistors 308, 310. The second reflection detection module 208 is deactivated as it does not detect any voltage on the transmission line 106 less than the one-fourth amplitude. The second reflection detection module 208 drives a high voltage to the reset input 382 of the flip-flop circuit 360.

At points 5, the second forward signal traveling down the transmission line 106 is shown at the 95% distance point from the second output driver module 204, prior to the signal reaching the end of line point and after the second forward signal reflects from the end of line point. When the second forward signal hits the end of line point, the second forward signal doubles in amplitude from nearly zero amplitude to approximately 1 volt beyond full amplitude (approximately 5 volts assuming 4 volts is full amplitude). This is a result of the voltage swing of the second forward signal from near zero amplitude to two-thirds amplitude, such that the total voltage swing is over 2.5 volts before the second forward signal hits the end of line where the amplitude is doubled.

At points 6, the second return signal is propagated back towards the second output driver module 204. When the second return signal amplitude passes above the one forth amplitude of the supply voltage, the first reflection detection module 206 is activated and drives a low voltage to the set input 380 of the flip-flop circuit 360. The flip-flop circuit 360 will in turn drive the Q output 384 high and the QNOT output 386 low. When the Q output 384 is driven high, the op-amp 302 will turn on transistors 304, 306 thereby activating the voltage divider made by the resistors 308, 310. When QNOT output 386 is low, the flip-flop circuit 360 turn off transistors 324, 326 thereby deactivating the voltage divider made by the resistors 328, 330. The first reflection detection module 206 is deactivated as it does not detect any voltage on the transmission line 106 higher than the three-fourths amplitude. Note that the one fourth and three fourth amplitude level settings for the reflection detection modules 206, 208 are used here for sake of example in order to be sufficiently far enough away from the one third and two thirds amplitude setting of the driver output level. This is to prevent driver output levels from being confused with reflection amplitude levels (however, other amplitudes are possible depending on the application). The first reflection detection module 206 drives a high voltage to the set input 380 of the flip-flop circuit 360.

Figure 5:
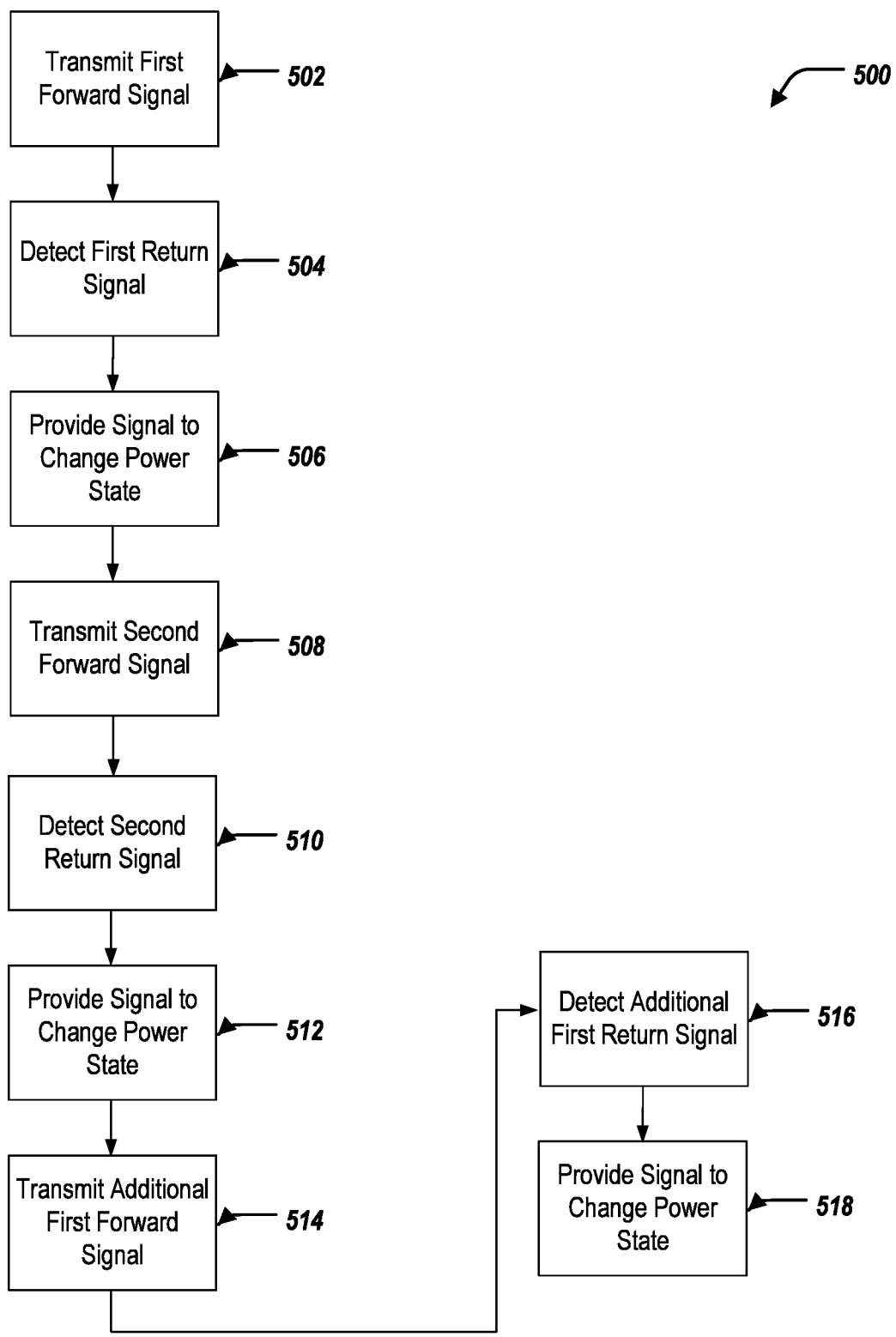
FIG. 5 illustrates a method for matching a resonant frequency of a transmission line.

FIG. 5 illustrates a flowchart depicting selected elements of an embodiment of a method 500 for matching a resonant frequency of a transmission line. The method 500 may be performed by the oscillating driver module 108, and with reference to FIGS. 1-4. It is noted that certain operations described in method 500 may be optional or may be rearranged in different embodiments.

The first output driver module 202 transmits a first forward signal of a first magnitude along a first direction of the transmission line 106, at 502. The first reflection detection module 206 detects a first return signal of the first forward signal reflected along a second direction of the transmission line 106, at 504. The first reflection detection module 206, in response to detecting the first return signal of the first forward signal reflected along the second direction of the transmission line 106, provides a signal to the flip-flop circuit 360 to i) change a power state of the first output driver module 202 to an off-power state and to ii) change a power state of the second output driver module 204 to an on-power state, at 506. The second output driver module 204, in response to the change in the power state of the second output driver module 204 to the on-power state, transmits a second forward signal of a second magnitude along the first direction of the transmission line 106, at 508. The second reflection detection module 208 detects a second return signal of the second forward signal reflected along the second direction of the transmission line 106, at 510. The second reflection detection module 208, in response to detecting the second return signal of the second forward signal reflected along the second direction of the transmission line 106, provides a signal to the flip-flop circuit 360 to i) change the power state of the first output driver module 202 to an on-power state and to ii) change the power state of the second output driver module 204 to an off-power state, at 512.

The first output driver module 202, in response to the change in the power state of the first output driver module 202 to the on-power state, transmits an additional first forward signal of the first magnitude along the first direction of the transmission line 106, at 514. The first reflection detection module 206 detects an additional first return signal of the additional first forward signal reflected along the second direction of the transmission line 106, at 516. The first reflection detection module 206, in response to detecting the additional first return signal of the additional first forward signal reflected along the second direction of the transmission line 106, provides an additional signal to the flip-flop circuit 360 to i) change the power state of the first output driver module 202 to an off-power state and to ii) change the power state of a second output driver module 204 to an on-power state, at 518.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A self-calibrating transmission line resonator oscillating driver apparatus, comprising:
   a first output driver module configured to transmit a first forward signal of a first magnitude along a first direction of a transmission line;
   a second output driver module configured to transmit a second forward signal of a second magnitude along the first direction of the transmission line;
   a first reflection detection module configured to detect a first return signal of the first forward signal reflected along a second direction of the transmission line; and
   a second reflection detection module configured to detect a second return signal of the second forward signal reflected along the second direction of the transmission line;
   wherein, when the first reflection detection module detects the first return signal of the first forward signal reflected along the second direction of the transmission line, providing a signal to i) change a power state of the first output driver module to an off-power state and to ii) change a power state of the second output driver module to an on-power state,
   wherein, when the second reflection detection module detects the second return signal of the second forward signal reflected along the second direction of the transmission line, providing a signal to i) change the power state of the first output driver module to an on-power state and to ii) change the power state of the second output driver module to an off-power state.

2. The apparatus of claim 1, wherein an amplitude of the second forward signal is twice an amplitude of the first forward signal.

3. The apparatus of claim 2, wherein the amplitude of the first forward signal is one-third of a supply voltage to the transmission line, and the amplitude of the second forward signal is two-thirds of the supply voltage to the transmission line.

4. The apparatus of claim 1, wherein the second forward signal is 180 degrees out of phase with the first forward signal.

5. The apparatus of claim 1, wherein the first forward signal and the first return signal are in-phase.

6. The apparatus of claim 1, wherein an amplitude of the first return signal is twice an amplitude of the first forward signal.

7. The apparatus of claim 1, wherein the transmission line is an unterminated transmission line having infinite impedance at the end of the line.

8. The apparatus of claim 1, wherein only one of the first output driver module and the second output driver module are in a powered-on state at a time.

9. The apparatus of claim 1, wherein only one of the first output driver module and the second output driver module are transmitting the first forward signal and the second forward signal, respectively, at a time.

10. A method of matching a resonant frequency of a transmission line, including:
   transmitting, by a first output driver module, a first forward signal of a first magnitude along a first direction of the transmission line;
   detecting, by a first reflection detection module, a first return signal of the first forward signal reflected along a second direction of the transmission line;
   in response to detecting the first return signal of the first forward signal reflected along the second direction of the transmission line, providing, by the first reflection detection module, a signal to i) change a power state of the first output driver module to an off-power state and to ii) change a power state of a second output driver module to an on-power state;
   in response to the change in the power state of the second output driver module to the on-power state:
      transmitting, by the second output driver module, a second forward signal of a second magnitude along the first direction of the transmission line;
      detecting, by a second reflection detection module, a second return signal of the second forward signal reflected along the second direction of the transmission line; and
   in response to detecting the second return signal of the second forward signal reflected along the second direction of the transmission line, providing, by the second reflection detection module, a signal to i) change the power state of the first output driver module to an on-power state and to ii) change the power state of the second output driver module to an off-power state.

11. The method of claim 10, further comprising:
   in response to the change in the power state of the first output driver module to the on-power state:
      transmitting, by the first output driver module, an additional first forward signal of the first magnitude along the first direction of the transmission line;
      detecting, by the first reflection detection module, an additional first return signal of the additional first forward signal reflected along the second direction of the transmission line; and
   in response to detecting the additional first return signal of the additional first forward signal reflected along the second direction of the transmission line, providing, by the first reflection detection module, an additional signal to i) change the power state of the first output driver module to an off-power state and to ii) change the power state of a second output driver module to an on-power state.

12. The method of claim 10, wherein an amplitude of the second forward signal is twice an amplitude of the first forward signal.

13. The method of claim 12, wherein the amplitude of the first forward signal is one-third of a supply voltage to the transmission line, and the amplitude of the second forward signal is two-thirds of the supply voltage to the transmission line.

14. The method of claim 10, wherein the second forward signal is 180 degrees out of phase with the first forward signal.

15. The method of claim 10, wherein the first forward signal and the first return signal are in-phase.

16. The method of claim 10, wherein an amplitude of the first return signal is twice an amplitude of the first forward signal.

17. The method of claim 10, wherein the transmission line is an unterminated transmission line having infinite impedance at the end of the line.

18. The method of claim 10, wherein only one of the first output driver module and the second output driver module are in a powered-on state at a time.

19. The method of claim 10, wherein only one of the first output driver module and the second output driver module are transmitting the first forward signal and the second forward signal, respectively, at a time.

20. A self-calibrating transmission line resonator oscillating driver apparatus, comprising:

a first output driver module configured to transmit a first forward signal of a first magnitude along a first direction of a transmission line;

a second output driver module configured to transmit a second forward signal of a second magnitude along the first direction of the transmission line, wherein the second magnitude of the second forward signal is twice an amplitude of the first forward signal and the second forward signal is 180 degrees out of phase with the first forward signal;

a first reflection detection module configured to detect a first return signal of the first forward signal reflected along a second direction of the transmission line; and a second reflection detection module configured to detect a second return signal of the second forward signal reflected along the second direction of the transmission line;

wherein, when the first reflection detection module detects the first return signal of the first forward signal reflected along the second direction of the transmission line, providing a signal to i) change a power state of the first output driver module to an off-power state and to ii) change a power state of the second output driver module to an on-power state, wherein, when the second reflection detection module detects the second return signal of the second forward signal reflected along the second direction of the transmission line, providing a signal to i) change the power state of the first output driver module to an on-power state and to ii) change the power state of the second output driver module to an off-power state, wherein only one of the first output driver module and the second output driver module are in a powered-on state at a time.

* * * * *